United States Patent
Chen et al.

(10) Patent No.: US 9,997,351 B2
(45) Date of Patent: Jun. 12, 2018

(54) APPARATUS AND TECHNIQUES FOR FILLING A CAVITY USING ANGLED ION BEAM

(71) Applicant: Varian Semiconductor Equipment Associates, Inc., Gloucester, MA (US)

(72) Inventors: Tsung-Liang Chen, Danvers, MA (US); John Hautala, Beverly, MA (US); Shurong Liang, Poughkeepsie, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 14/962,642

(22) Filed: Dec. 8, 2015

(65) Prior Publication Data

US 2017/0162384 A1    Jun. 8, 2017

(51) Int. Cl.
| | | |
|---|---|---|
| *H01L 21/311* | (2006.01) | |
| *H01L 21/02* | (2006.01) | |
| *C23C 16/513* | (2006.01) | |
| *H01L 21/762* | (2006.01) | |
| *H01L 21/768* | (2006.01) | |
| *C23C 16/04* | (2006.01) | |
| *C23C 16/40* | (2006.01) | |

(52) U.S. Cl.
CPC ...... *H01L 21/02274* (2013.01); *C23C 16/045* (2013.01); *C23C 16/402* (2013.01); *C23C 16/513* (2013.01); *H01L 21/02164* (2013.01); *H01L 21/02211* (2013.01); *H01L 21/31116* (2013.01); *H01L 21/76224* (2013.01); *H01L 21/76831* (2013.01)

(58) Field of Classification Search
CPC ..... C23C 16/40; C23C 16/045; C23C 16/047; C23C 16/503; C23C 16/505; H01L 21/0262; H01L 21/02164; H01L 21/02211; H01L 21/02274
See application file for complete search history.

(56) References Cited

U.S. PATENT DOCUMENTS

| | | | | |
|---|---|---|---|---|
| 5,913,140 A | * | 6/1999 | Roche | C23C 16/045 257/E21.279 |
| 6,106,678 A | * | 8/2000 | Shufflebotham | C23C 16/045 204/192.3 |
| 7,205,240 B2 | * | 4/2007 | Karim | C23C 16/045 118/696 |

(Continued)

OTHER PUBLICATIONS

ISR and Written Opinion dated Feb. 28, 2017 (Feb. 28, 2017) in corresponding PCT/US2016/064169.

*Primary Examiner* — Syed Gheyas (57) ABSTRACT

A method may include generating a plasma in a plasma chamber and directing the ions comprising at least one of a condensing species and inert gas species from the plasma to a cavity within a substrate at a non-zero angle of incidence with respect to a perpendicular to a plane of the substrate. The method may further include; depositing a fill material within the cavity using the condensing species, the depositing taking place concurrently with the directing the ions, wherein the fill material accumulates on a lower surface of the cavity at a first rate, and wherein the fill material accumulates on an upper portion of a sidewall of the cavity at a second rate less than the first rate.

14 Claims, 5 Drawing Sheets

(56) References Cited

U.S. PATENT DOCUMENTS

| | | | | |
|---|---|---|---|---|
| 7,217,658 | B1* | 5/2007 | Bayman | C23C 16/045 257/17 |
| 8,062,536 | B2* | 11/2011 | Liu | H01L 21/02112 216/19 |
| 2005/0054157 | A1 | 3/2005 | Hsu | |
| 2006/0019487 | A1 | 1/2006 | Leuschner et al. | |
| 2006/0042752 | A1 | 3/2006 | Rueger | |
| 2014/0272179 | A1* | 9/2014 | Radovanov | H01J 37/32357 427/523 |
| 2015/0093907 | A1 | 4/2015 | Yieh et al. | |
| 2015/0311073 | A1 | 10/2015 | Srinivasan et al. | |

* cited by examiner

APPARATUS AND TECHNIQUES FOR FILLING A CAVITY USING ANGLED ION BEAM

FIELD OF THE DISCLOSURE

The present embodiments relate to substrate processing, and more particularly, to techniques for filling a cavity such as a trench or via.

BACKGROUND OF THE DISCLOSURE

As devices such as semiconductor devices, memory devices, and other devices scale to smaller dimensions, the ability to process increasingly smaller structures becomes challenging. In the fabrication of devices such as memory or logic devices cavities such as trenches or vias may be formed within a given layer or material and may be subsequently filled with another material. For example, a trench may be formed within a silicon layer and may subsequently be filled with an insulator material such as silicon oxide or silicon nitride.

Known methods for filling trenches include chemical vapor deposition, such as high density plasma (HDP) chemical vapor deposition (CVD). The HDPCVD process may entail performing chemical vapor deposition using multiple species, including, for example, silane, argon, oxygen (for oxide), or $NH_3$ (for nitride). The HDPCVD process may include species whose role is to deposit material as well as species to at least partially etch material. When used to fill a trench, the HDPCVD process may provide gas molecules such as argon as ionized species impacting the trench region. Species such as silane and oxygen may be additionally provided to deposit dielectric material within the trench. The dielectric material deposited on the surface of the trench may simultaneously be subject to sputter-etching from argon species, where filling of the trench includes deposition and etching. As trenches scale to smaller dimensions, and are formed having higher aspect ratios (trench depth (height)/trench width), the HDPCVD process may be ineffective in providing an ideal structure of the trench to be filled. For example, facets may form as the trench is filled. Additionally, growth on sidewalls of depositing material, as well as redeposition from sputtering of material may result in material overhang along sidewalls. This process may result in what is termed pinch off, and the resultant formation of buried voids within a trench.

With respect to these and other considerations, the present disclosure is provided.

SUMMARY OF THE DISCLOSURE

In one embodiment, a method may include generating a plasma in a plasma chamber; directing the ions comprising at least one of a condensing species and inert gas species from the plasma to a cavity within a substrate at a non-zero angle of incidence with respect to a perpendicular to a plane of the substrate. The method may further include depositing a fill material within the cavity using the condensing species. The depositing may take place concurrently with the directing the ions; wherein the fill material accumulates on a lower surface of the cavity at a first rate, and wherein the fill material accumulates on an upper portion of a sidewall of the cavity at a second rate less than the first rate.

In another embodiment, an apparatus may include a plasma chamber, a first gas source and a second gas source to provide inert gas and condensing species, respectively, to the plasma chamber, and a plasma generator to generate in the plasma chamber a plasma comprising first ions derived from the inert gas second ions derived from the condensing species. The apparatus may further include an extraction assembly to extract an ion beam the first ions and the second ions from the plasma, and to direct the ion beam in a deposition exposure to a cavity within a substrate at a non-zero angle of incidence with respect to a perpendicular to a plane of the substrate. The apparatus may further include a controller to control a set of deposition parameters. The apparatus may also include at least one computer-readable storage medium comprising instructions, where the instructions, when executed, cause the controller to perform at least one of: sending a first control signal to adjust the non-zero angle of incidence during the deposition exposure, and sending a second control signal to adjust a gas flow of the condensing species into the plasma chamber.

In another embodiment, a method may include generating a plasma in a plasma chamber, and directing ions comprising at least one of a condensing species and inert gas species from the plasma to a cavity within a substrate, where the cavity comprises a lower surface and a sidewall. The method may also include depositing a fill material within the cavity using the condensing species. In addition, the method may include performing a selective etch comprising directing an etchant ion beam from the plasma chamber to the cavity at a select non-zero angle of incidence with respect to a perpendicular to the plane of the substrate. In this manner, fill material deposited on an upper portion of the sidewall may be selectively removed with respect to fill material disposed in other regions of the cavity.

BRIEF DESCRIPTION OF THE DRAWINGS

FIG. 3A depicts an exemplary processing system according to embodiments of the disclosure, while

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

Methods and apparatus in accordance with the present disclosure will now be described more fully hereinafter with reference to the accompanying drawings, where embodiments of the methods and apparatus are shown. The methods and apparatus may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" may be used herein to describe the relative placement and orientation of these components and their constituent parts, each with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

In various embodiments, techniques and apparatus are disclosed providing improved processing of a cavity in a substrate, such as improved filling of a trench or a via. In particular, the present disclosure involves the use of an angled ion beam during cavity filling, where ions are directed to a substrate at a non-zero angle of incidence with respect to a perpendicular to a substrate plane.

Figure 1A:
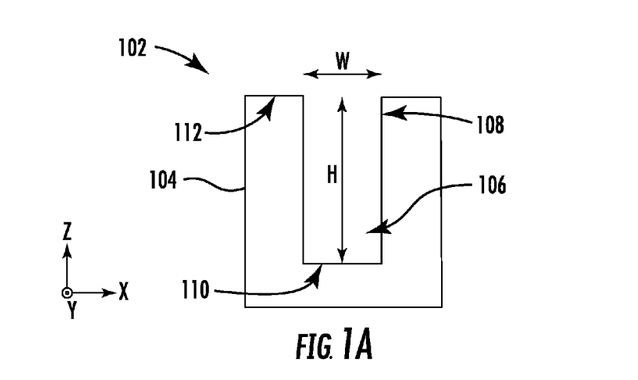
FIG. 1A, FIG. 1B, FIG. 1C, FIG. 1D, and FIG. 1E collectively depict an example of filling a cavity according to embodiments of the disclosure.
Figure 1B:
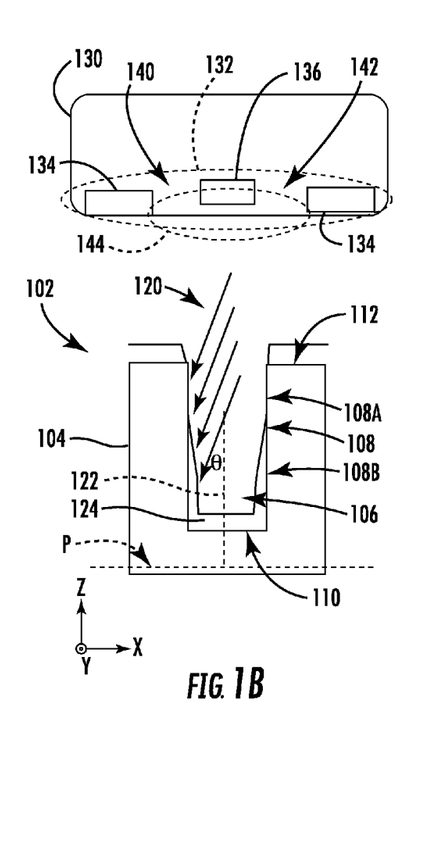
Figure 1C:
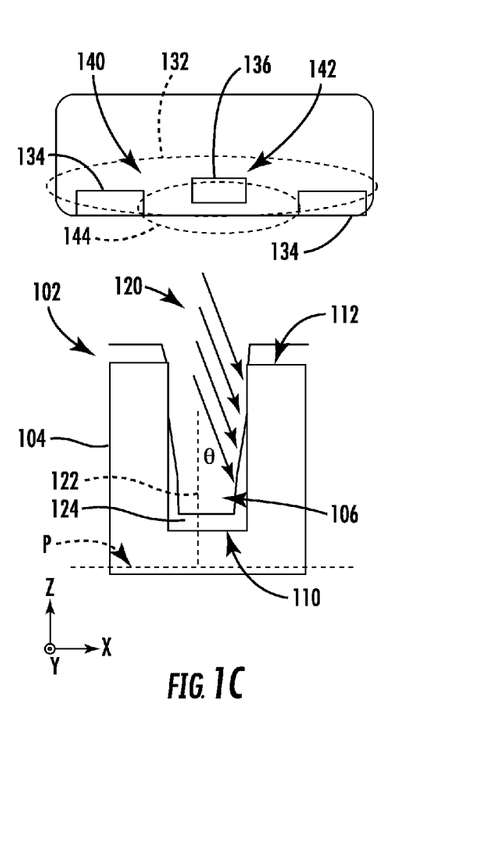

FIG. 1A, FIG. 1B, FIG. 1C, FIG. 1D, and FIG. 1E collectively depict an example of filling a cavity according to embodiments of the disclosure. The scenarios shown in FIG. 1A, FIG. 1B, and FIG. 1C illustrate different instances of processing of a device structure 102. In FIG. 1A, the device structure 102 is shown as a substrate 104 including a cavity 106. In various embodiments, the cavity may be a trench, a via, or similar structure, having a sidewall 108, a lower surface 110, and upper surface 112. The substrate 104 may include other features not shown and may include, for example, any number of layers, where at least some layers are made of different materials. The substrate 104 may include, for example, multiple cavities similar to cavity 106. The substrate 104 may be composed of a given material, where the sidewall 108, lower surface 110, and upper surface 112 are composed of the same material. The embodiments are not limited in this context. The substrate material may in some examples be composed of monocrystalline silicon or other form of silicon, oxide, or nitride. The embodiments are not limited in this context.

In particular embodiments, the dimensions of the cavity 106 may be less than 100 nm along at least one direction. For example, the cavity 106 may have a trench structure where the width W of the trench is less than 100 nm. In some examples, the height H of such a trench may be greater than 100 nm. In such an example, the aspect ratio H/W is deemed to be greater than one. The embodiment of FIGS. 1A-1C addresses challenges for filling a cavity, such as a cavity having the aforementioned small dimensions, including having an aspect ratio greater than one. The embodiments are not limited in this context.

Turning now to FIG. 1B and FIG. 1C, there is shown an instance of employing ions for filling the cavity 106, according to embodiments of the disclosure. In some embodiments, the ions 120 may be provided as an ion beam or ion beams, where different ion trajectories within an ion beam are parallel to one another or lie generally within an angular range spanning 10 degrees or less. The embodiments are not limited in this context. The operations performed in FIG. 1B and FIG. 1C may be performed simultaneously or sequentially in different embodiments. As shown in FIG. 1B, ions 120 may be provided as a directional ion beam where the ion trajectories are arranged to form a non-zero angle of incidence shown as the angle θ, with respect to a perpendicular 122 to a plane P of the substrate 104. As further illustrated in FIG. 1B, the ions 120 may be provided from a plasma source 130, where the plasma source 130 may include a plasma chamber in various embodiments. As used herein, the generic term "plasma source" may include a power generator, plasma exciter, plasma chamber, and the plasma itself. The plasma source 130 may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, or other plasma sources known to those skilled in the art. In particular embodiments, the plasma source 130 may include an extraction assembly 132 containing an extraction plate 134 and beam blocker 136. The operation of these components is discussed in more detail with respect to FIGS. 3A and 3B.

The plasma source 130 may be used to provide ion species including condensing species as well as inert gas species. As detailed below, these species may be interoperative to control deposition of fill material within the cavity 106 in a manner enhancing bottom-up growth of a fill material. In this manner, pinch-off may be avoided, preventing the formation of unwanted voids within the cavity 106.

In particular embodiments, the ions 120 may include a mix of inert gas species and condensing species, while in other embodiments, the ions 120 may include condensing species. The composition of species in the plasma source 130 may be similar of the compositions for known HDP-CVD processes used to deposit known materials. For example, in examples of depositing a fill material such as $SiO_2$, species including silane ($SiH_4$), $N_2O$, and argon may be provided to the plasma source 130. At least some of these species may be ionized and may form the ions 120 as shown. In other embodiments, such as using silane and oxygen ($O_2$) to form $SiO_2$, the oxygen may delivered separately to the substrate 104, as discussed below. In various embodiments, in addition to the ions 120, neutral species (not shown) including depositing species to help form fill material in the cavity 106 may be provided to the substrate 104 in concert with the ions 120. The neutral species may have trajectories different than the trajectories of ions 120 in some cases.

In particular embodiments, neutral species provided to the substrate 104 in conjunction with the ions 120 may include a reactive species (not shown), where the reactive species is provided to the substrate 104 without traversing a plasma chamber. The reactive species may be chosen to react with other species including other neutral species or condensing species forming part of the ions 120. The reactive species may accordingly form part of a fill material accumulating within the cavity 106. Examples of fill material 124 according to embodiments of the disclosure include $SiO_2$, $Si_3N_4$, $Al_2O_3$, amorphous silicon, CO, Ta, W, Al. The embodiments are not limited in this context.

In the embodiments of FIG. 1B and FIG. 1C, the accumulation of a fill material 124 within cavity 106 may be controlled by controlling the directionality of ions 120. For example, fill material 124 may instantaneously deposit on various surfaces of cavity 106 including the lower surface 110, sidewalls 108, and upper surface 112. At the same time, ions 120 may be provided with sufficient energy to initiate etching, such as re-sputtering of material from surfaces exposed to the ions 120. By controlling the trajectory of ions 120, certain portions of the cavity 106 may be targeted for etching by the ions 120 while fill material 124 is deposited within the cavity 106. The net accumulation profile of fill material 124 may accordingly represent a combination of deposition and spatially-targeted etching of portions of the cavity 106.

As shown in FIG. 1B and FIG. 1C, fill material 124 may accumulate on lower surface 110 of the cavity 106 at a first rate, may accumulate on a lower portion 108B of sidewall 108 at a different rate or similar rate to the first rate. Additionally, fill material 124 may accumulate on an upper portion 108A of the sidewall 108 at a second rate less than the first rate. In particular embodiments, the non-zero angle of incidence shown as θ may be 30 degrees or less with respect to perpendicular 122. The ions 120 may accordingly strike exposed regions of sidewalls 108, reducing the accumulation rate of fill material 124 in the exposed regions, such as upper portion 108A. In various embodiments, the ion energy of ions 120 may be tuned to generate etching of fill material 124 without causing unwanted damage to device 102. Exemplary ion energy range for ions 120 include 500 eV to 1500 eV. Because of shadowing of ions 120 by upper surface 112, lower regions of the cavity 106 may be less exposed to etching by ions 120. In this manner, accumulation rate of material on lower surface 110 and lower portion 108B of sidewalls 108 may be primarily determined by the deposition rate of depositing species forming the fill material 124.

Figure 1D:
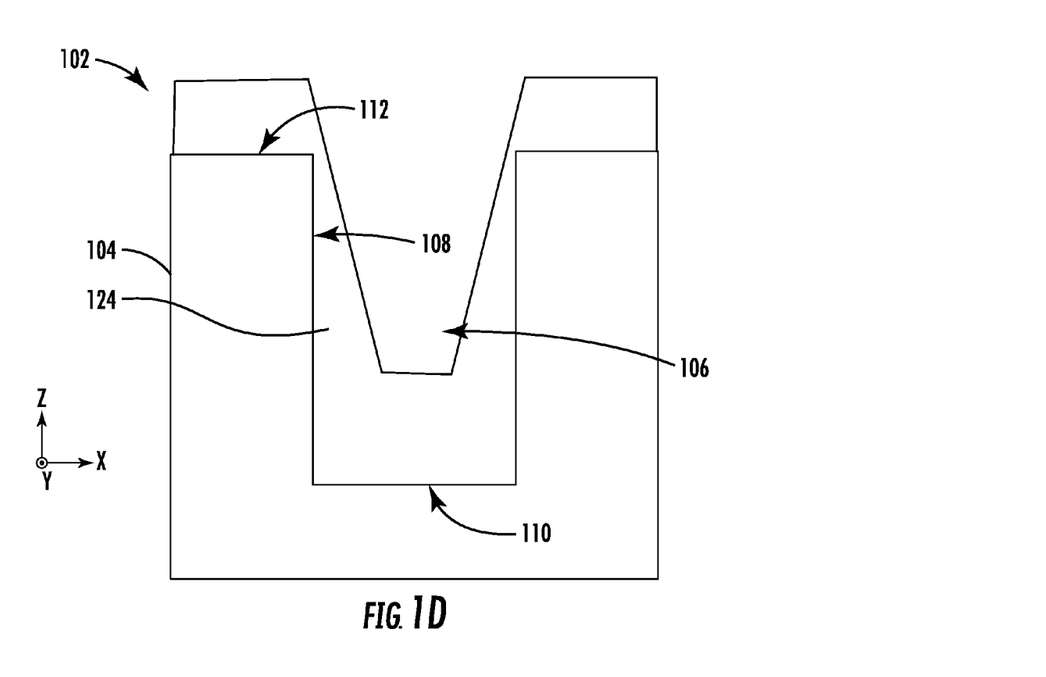
Figure 1E:
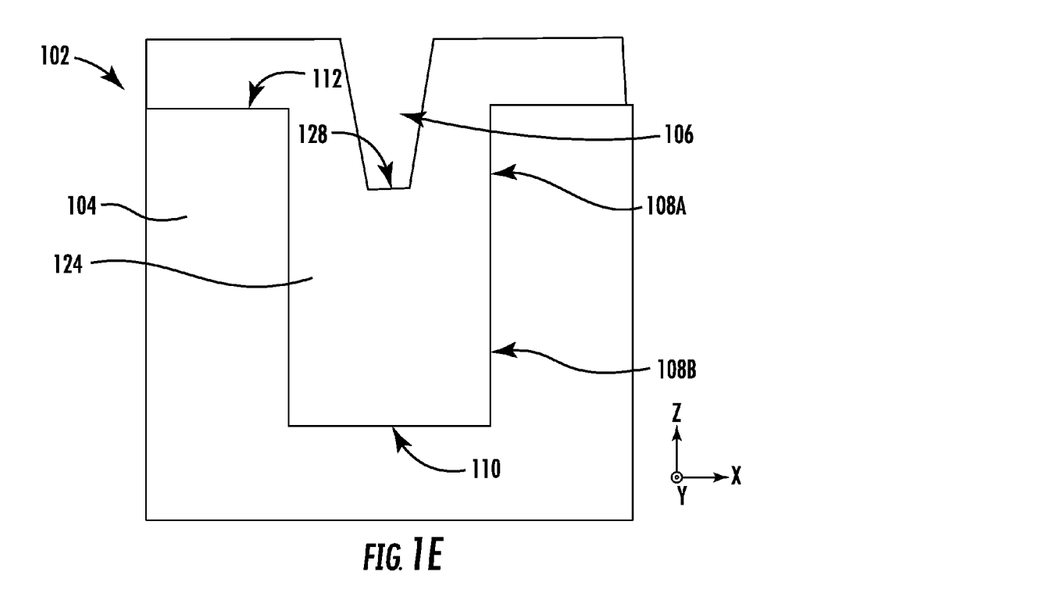

FIG. 1D and FIG. 1E illustrate the evolution of a profile of the fill material 124 at instances subsequent to the scenario of FIG. 1D and FIG. 1E. To generate the structure of fill material 124 shown in FIG. 1D or in FIG. 1E, the operations generally shown in FIG. 1B and FIG. 1C may be repeated or continued. As noted, non-ionized material may in part condense within the cavity 106, while the ions 120 are directed into the cavity 106 at a non-zero angle of incidence. This process results in the continued accumulation of fill material 124 faster near the lower surface 110 and near the lower portion 108B as opposed to in regions near the upper portion 108A. FIG. 1E shows an additional instance subsequent to the scenario of FIG. 1D, where the lower surface of fill material 124, representing a lowest surface, is nearly flush with the upper surface 112 of the cavity 106. The fill process illustrated in FIGS. 1A-1E accordingly generates a non-reentrant profile in the fill material 124 during the different stages of deposition of fill material 124, resulting in the ability to fill the cavity 106 without pinch off or void formation.

Figure 2A:
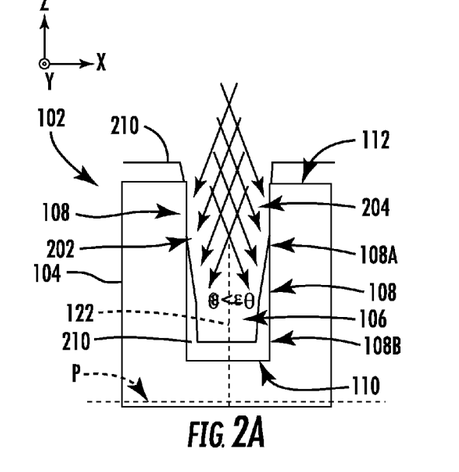
FIG. 2A, FIG. 2B, FIG. 2C, FIG. 2D, and FIG. 2E collectively illustrate filling a cavity according to additional embodiments of the disclosure.

In accordance with additional embodiments of the disclosure, a separate etch operation may be employed in addition to a deposition operation to control the profile of fill material being used to fill a cavity. FIG. 2A, FIG. 2B, FIG. 2C and FIG. 2D collectively illustrate filling a cavity according to additional embodiments of the disclosure. In FIG. 2A, an exemplary fill operation is depicted where ions are directed to the cavity 106 at a non-zero angle of incidence with respect to the perpendicular 122. In this particular embodiment, ions 202 may be directed at one sidewall, while ions 204 are directed at an opposite sidewall, where the two sidewalls are shown as sidewall 108. The ions 202 and ions 204 may be provided to the cavity 106 concurrently with non-ionized species (not shown), where at least a portion of the non-ionized species may result in deposition of a fill material. The ions 202 and ions 204 may be provided simultaneously to one another in some embodiments.

Referring again to FIG. 1B, in one example, the ions 202 and ions 204 may be provided by extracting ions as ion beams from the plasma source 130 through an extraction aperture 144, where the extraction aperture 144 is formed within the extraction assembly 132. In particular, a first portion of ions, shown as ions 202, may be extracted as a first ion beam through a first portion of the extraction aperture 144, while a second portion of ions, shown as ions 204, may be extracted through a second portion of the extraction aperture 144. In one embodiment, the ions 202 may form a first non-zero angle of incidence with respect to the perpendicular 122, shown as angle θ, while the ions 204 form a second non-zero angle of incidence with respect to the perpendicular 122, shown as the angle −θ. In particular, the perpendicular 122 may bisect the first non-zero angle of incidence −θ, and second non-zero angle of incidence −θ. For a symmetrical cavity structure of cavity 106, this geometry may cause the ions 202 and ions 204 to intercept the same respective portions of opposite sidewalls at the same (absolute value of) angle of incidence. Under such circumstances, a symmetrical profile of fill material 210 may develop. In other embodiments, the ions 202 and ions 204 may be provided at different angles with respect to the perpendicular 122.

While the process generally shown in FIG. 2A may result in an acceptable profile of fill material 210 during growth, as generally illustrated in FIGS. 1B-1E, under some circumstances at least one etching operation may be useful to perform subsequent to the scenario of FIG. 2A. This etching may further reduce enhance filling of the cavity 106 by a bottom-up process, avoiding pinch-off and buried voids.

Figure 2B:
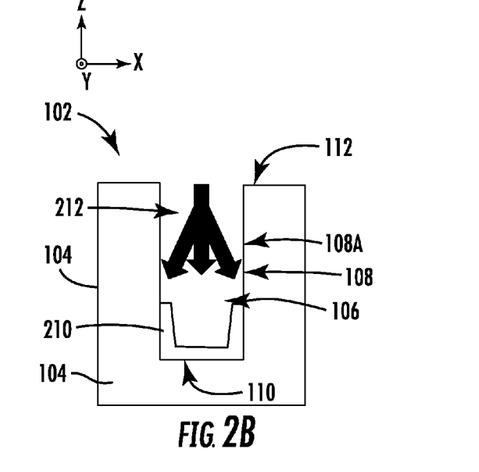

Turning now to FIG. 2B, there is shown a scenario subsequent to FIG. 2A where an etch process is performed to remove a portion of the fill material 210. In FIG. 2B, an etchant 212 is directed to the cavity 106. In various embodiments, the etchant 212 may be a selective etchant, where the etchant 212 results in performing a selective etch of the fill material 210. In particular, a portion of the fill material 210 may be selectively removed with respect to the material of the substrate 104. The etchant 212 may include known species for selective etching. For example, in an embodiment where the fill material being deposited in $SiO_2$ and the cavity 106 is formed in silicon, the etchant 212 may be derived from $CH_3F$. In particular examples, the $CH_3F$ may be flowed into a plasma source, such as the plasma source 130, and may be at least partially ionized and provided to the cavity 106. In FIG. 2B, the resultant profile of the fill material 210 is shown after a selective etch process is performed by the etchant 212. Fill material 210 is removed from along the upper portion 108A of the sidewall 108, while not removing material of the substrate 104.

Figure 2C:
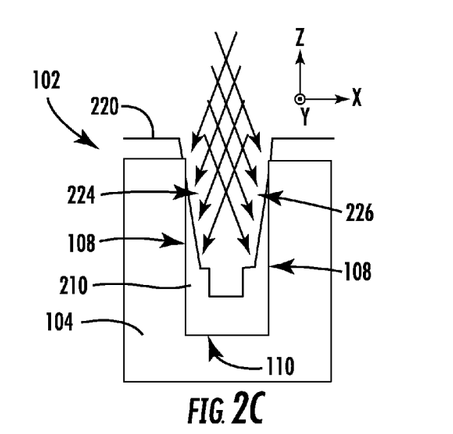
Figure 2D:
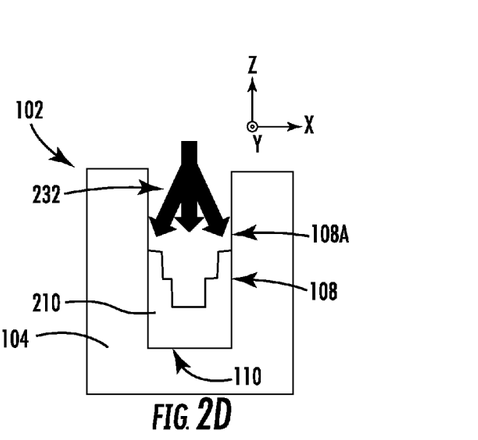
Figure 2E:
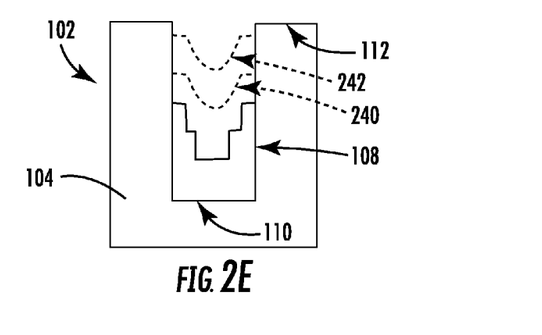

In various embodiments, depositing fill material 210 and performing a selective etch of fill material may constitute a fill cycle, where at least one additional fill cycle is performed after an initial fill cycle. As illustrated in FIG. 2C, for example, a subsequent deposition process similar to the operation of FIG. 2A may be performed to deposit additional fill material 210. As illustrated, an ion beam, shown as ions 224, and another ion beam, shown as ions 226, may be directed toward a pair of opposing sidewalls, while non-ionized species (not shown) may be provided to the cavity 106. This may generate the profile of fill material 210 as shown. In FIG. 2D, an additional selective etch may be performed by directing etchant 232 into the cavity 106 subsequent to the deposition shown in FIG. 2C. In some embodiments, the etchant 232 may be the same as etchant 212. Again, fill material 210 may be selectively removed from upper portion 108A of the sidewall 108. While in some embodiments, etchant 232, as well as etchant 212, may partially etch fill material 210 near lower surface 110, as the operations of FIGS. 2A-2B are repeated multiple times, the overall profile of the fill material 210 may continue to be non-reentrant, allowing the cavity 106 to be filled while avoiding pinch off structures. FIG. 2E shows an example of evolution of fill material profiles generated when the operations of FIGS. 2A-2B are repeated multiple times. Profile 240 illustrates the fill material profile of fill material 210 at first instance after the scenario of FIG. 2D, while profile 242 shows a second instance after the instance represented by profile 240.

In some embodiments, in the scenarios of FIG. 2B and FIG. 2D, for example, a selective etchant may be provided to the cavity 106 as ions directed at a non-zero angle of incidence with respect to perpendicular 122, similar to the geometry of ions 202 and ions 204. In this manner, the selective etchant may etch just portions of a fill material exposed to the ions, while other portions of the fill material, such as portions adjacent the lower surface 110, may be unexposed to etching. An example of such a selective etchant may include $CH_3F$. Another example of a selective etchant may be $CH_3F$ and argon mixture. In some examples where a portion of the cavity sidewalls remains exposed after a deposition process, the ion energy of a beam of ions may be maintained below a level where significant sputtering of exposed substrate material forming the cavity walls takes place.

This type of selective etching accordingly provides spatially selective etching because certain regions of a cavity remain unexposed to the ions, while also providing chemical selectivity, wherein the substrate 104 remains unetched or is etched at a reduced rate with respect to etching of the fill material. In this manner, a bottom-up fill process may be enhanced by favoring deposition of fill material toward a lower portion of a cavity while removing fill material from upper regions of sidewalls.

In yet another embodiment, a known deposition operation for depositing fill material may be followed by a selective etch of the fill material where ions forming a selective etchant are directed toward cavity sidewalls, generally according to the geometry as shown in FIG. 2A, for example. An example of a known deposition operation involves an HDPCVD process where ions are directed along a perpendicular to the substrate plane. While the use of a known HDPCVD process in of itself, may tend to generate a non-ideal profile for fill material in a cavity, in this embodiment, a deposition operation may be alternated with a selective etch operation using non-perpendicular ions, where fill material is preferentially removed along upper portions of sidewalls as opposed to lower regions.

In still further embodiments of the disclosure, the trajectories of ions directed toward a cavity may be adjusted during a fill process. For example, referring again to FIGS. 1B-1E, the magnitude of a non-zero angle of incidence of the ions 120 may be adjusted between the scenario of FIGS. 1B, 1C, on the one hand, and the scenario of FIG. 1D. In one particular example, the magnitude of θ may be 25 degrees in the scenario of FIGS. 1B and 1C, while the magnitude of θ may be reduced to 15 degrees in the scenario of FIG. 1D. The magnitude of θ may be further reduced to 10 degrees in the scenario of FIG. 1E. This adjustment may take place in discrete operations or in a continuous fashion in different embodiments. The adjustment of the magnitude of Gallows ions to be directed at appropriate angles at different stages of a fill process, as the angles of acceptance of a trench vary with the accumulation of fill material.

Figure 3A:
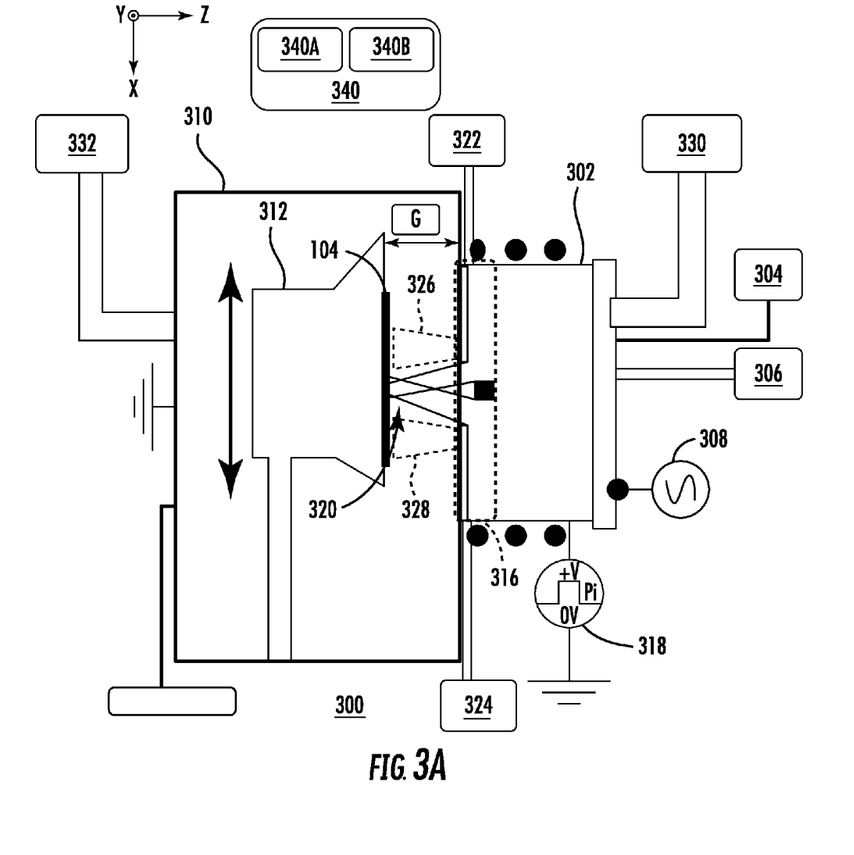

FIG. 3A depicts an exemplary processing system, shown as system 300, according to embodiments of the disclosure. The system 300 may be especially tailored to perform filling of cavities in a substrate according to the techniques disclosed herein. The system 300 may include a plasma chamber 302, a process chamber 310 and various known components including a plasma chamber pump 330 and process chamber pump 332. In different embodiments, the plasma chamber 302 may form part of an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, or other plasma sources known to those skilled in the art. As suggested in FIG. 3A, the plasma chamber 302 may be part of an inductively coupled plasma source driven by an RF power source 308. The system 300 may further include a gas source 304 providing a precursor gas to form condensing species. In one example, the precursor gas may be silane to be used for forming silicon oxide ($SiO_2$) or silicon nitride ($Si_3N_4$). The embodiments are not limited in this context. The gas source 306 may be used to provide an inert gas to plasma chamber 302, such as argon or other inert gas. Such an inert gas may form a part of the ions 120, ions 202, ions 204, ions 224, or ions 226, for example. The embodiments are not limited in this context. In additional embodiments, additional gas sources (not shown) may be coupled to the plasma chamber to provide other gases, such as oxygen-containing gases, or nitrogen-containing gases.

The system 300 may include a bias system 318 arranged to bias the plasma chamber 302 with respect to the process chamber 310. In the specific example shown in FIG. 3A, the process chamber 310 may be grounded while a positive voltage is applied by bias system 318 to the plasma chamber 302.

The system 300 may further include an extraction assembly 316, where the extraction assembly 316 is a variant of extraction assembly 132. The extraction assembly 316 may be disposed between a plasma created in the plasma chamber 302 and a substrate stage 312 disposed in the process chamber 310. The substrate stage 312 may be coupled to a substrate 104, and may be movable along a direction parallel to the X-axis. In some embodiments, the substrate stage 312 may be movable along a direction parallel to the Z-axis, and may additionally be movable along a direction parallel to the Y-axis.

When gas is provided to the plasma chamber 302 and power is supplied by RF power source 308, a plasma may be generated in the plasma chamber 302. When a bias voltage is applied to the plasma chamber 302, either in pulsed or continuous manner, ions may be extracted from the plasma in plasma chamber 302 and directed to the substrate 314. In the example depicted in FIG. 3A, an ion beam 320 is directed to the substrate 314 from plasma chamber 302. Referring also to FIG. 1B and FIG. 1C, the ion beam 320 of FIG. 3A may be directed as a pair of ion beams impinging upon the substrate 314 at non-zero angles of incidence with respect to the perpendicular 122. In the example of FIG. 3A, the perpendicular 122 is arranged parallel to the Z-axis of the Cartesian coordinate system shown.

In accordance with various embodiments, condensing species may be generated in the plasma chamber 302, where at least a portion of the condensing species form ions contained in the ion beam 320. The condensing species may further include neutrals as discussed above. A resultant profile of fill material generated by the system 300 may be similar to the profile for fill material shown in preceding figures.

In accordance with various embodiments, the system 300 may include a reactive gas assembly to provide reactive gas species to the substrate 104 without traversing the plasma chamber. In the example of FIG. 3A, a gas source 322 may supply a first gas 326 to the process chamber 310, while a gas source 324 may provide a second gas 328 to the process chamber 310. These gases may be provided using gas lines bypassing the plasma chamber 302 so the gases do not flow through the plasma chamber 302. For example, to deposit $SiO_2$ in a cavity according to the processes generally shown in FIGS. 1A to 2E, silane may be provided to the plasma chamber 302, where condensing species from the silane form a portion of the ion beam 320. In order to form $SiO_2$ within a cavity, a source of oxygen may be supplied in conjunction with the silane. In particular, flowing oxygen directly to the process chamber 310 using gas source 322 or gas source 324 may be useful. This may avoid any deposition in a delivery line by providing the source of oxygen in the growing fill material separate from condensing species supplying silicon.

Figure 3B:
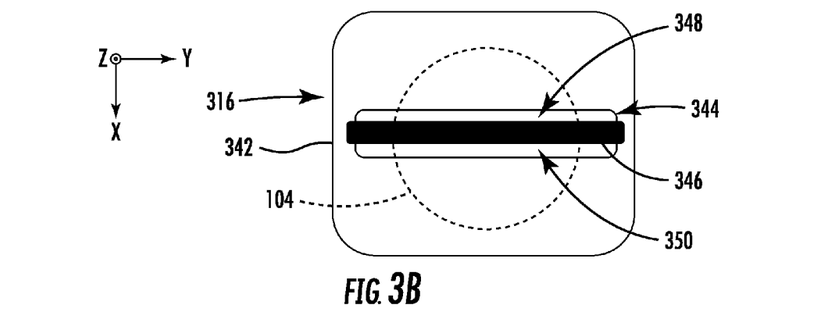
FIG. 3B shows a plan view of an embodiment of an extraction assembly shown in FIG. 3A.

Turning now to FIG. 3B, there is shown a plan view of an embodiment of the extraction assembly 316. In this example, the extraction assembly 116 includes an elongated extraction aperture 344 having a greater width along the Y-axis as opposed to a length along the X-axis. The extraction assembly 116 may also include a beam blocker 346 disposed adjacent the elongated extraction aperture 344. The beam blocker 346 and elongated extraction aperture 344 may thus be arranged to extract the ion beam 320 as a first ribbon beam through the gap 348, and to extract a second ribbon beam through the gap 350.

Such ribbon beams may be employed to expose an entire width of the substrate 104 at a given instance. This may expose multiple cavities 106 arranged across the substrate 104 to a fill process, as described in the aforementioned embodiments. The ribbon beams extracted through the elongated extraction aperture 344 may generally have trajectories parallel to the X-axis, while the trajectories also form a non-zero angle of incidence with respect to the Z-axis, or with respect to perpendicular 122. Thus multiple cavities such as trenches, disposed along the Y-axis across the width of the substrate 104 may be exposed in a similar fashion to the ion beam 320. An improved cavity fill process may accordingly be provided instantaneously across a width of the substrate 104. Moreover, by scanning the substrate 104 along the X-direction, a target region of the substrate 104, such as the entirety of substrate 104, may be exposed in a sequential fashion to the improved cavity fill process.

In accordance with some embodiments, the system 300 may be employed to perform a process involving alternating deposition and etch operations as shown, for example in FIGS. 2A-2D. For example, to fill a cavity with $SiO_2$, a deposition operation may entail flowing silane and argon into the plasma chamber 302 to form a plasma. The ion beam 320 may be directed to the substrate 104 while gas source 324 provides oxygen to the substrate 104 in a deposition operation for filling a cavity with $SiO_2$. In an etch operation, a gas such as $CH_3F$ may be provided to the plasma chamber 302, where the $CH_3F$ may be used to form an etching ion beam impacting targeted portions of a cavity 106. A purge operation may be performed between a given deposition operation and given etch operation to eliminate any cross-contamination between species used in the different operations.

In various embodiments, the system 300 may include components to provide dynamic profile control of fill material during filling of a cavity. In one example, as further shown in FIG. 3A, the system 300 may include a control system 340 used to control various components of the system 300. The control system 340 may include a controller 340A to control a set of deposition parameters, as well as etch parameters. The control system 340 may further include a medium 340B, such as at least one computer-readable storage medium including instructions, where the instructions, when executed, cause the controller 340A to perform certain operations. Included among these operations are sending a first control signal to adjust the non-zero angle of incidence of an ion beam during a deposition exposure, as well as sending a second control signal to adjust a gas flow of condensing species provided into the plasma chamber. Controlling of these operations, among other operations, provides the system 300 with the ability to provide uniquely tailored profiles of fill material within a given cavity.

In different embodiments, sending a first control signal used to adjust the non-zero angle of incidence may involve sending an adjust signal to the RF power source 308 to adjust power in a plasma in plasma chamber 302. In known plasma systems, adjusting plasma power may adjust the shape of a meniscus of the plasma formed at an extraction aperture, and may accordingly adjust the angle of extraction of ions from the plasma, resulting in a change of the non-zero angle of incidence of an ion beam incident on a cavity. As noted above, reduce the angle of incidence with respect to a perpendicular as a fill process proceeds may be useful. Accordingly, the control system 340 may be employed to periodically or continuously adjust plasma power during a deposition exposure to adjust the angle of incidence as the amount of fill material within a cavity increases. This may allow optimal tailoring of the evolving profile of the fill material to ensure proper filling of a cavity without pinch-off, for example.

In different embodiments, sending a first control signal used to adjust the non-zero angle of incidence may entail sending a move signal to adjust a separation between the substrate 104 and extraction assembly 316 along the direction parallel to the Z-axis. Adjusting this separation may also affect the non-zero angle of incidence of an ion beam extracted from the plasma chamber 302, and may therefore be used to dynamically change the angle of incidence of an ion beam during filling.

The sending of a control signal to adjust gas flow into plasma chamber 302 may be used to adjust silane flow during filling of a cavity with $SiO_2$, for example. This adjusting of silane flow may be used to adjust the ratio of deposition to etching during a fill process, and may accordingly affect the resulting profile of a fill material.

Figure 4:
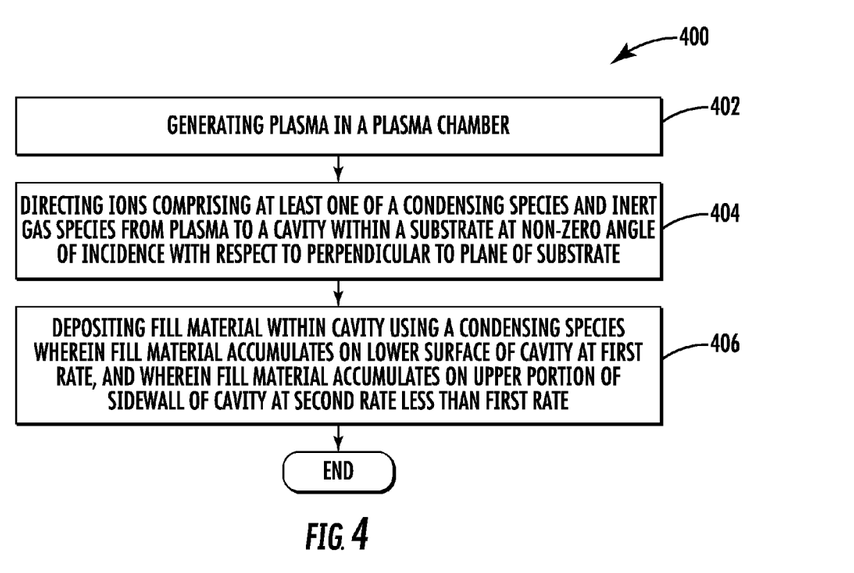
FIG. 4 depicts an exemplary process flow according to embodiments of the disclosure.

FIG. 4 shows an exemplary process flow 400 according to embodiments of the disclosure. At block 402, a plasma is generated in a plasma chamber. In some embodiments, the plasma may include condensing species as well as inert gas species.

At block 404, the operation is performed of directing ions comprising at least one of a condensing species and inert gas species from the plasma to a cavity within a substrate. In particular, the ions may be directed at non-zero angle of incidence with respect to perpendicular to plane of substrate.

At block 406, the operation is performed of depositing a fill material within the cavity using a condensing species. The fill material may accumulate on a lower surface of the cavity at first rate, and on an upper portion of a sidewall of the cavity at a second rate less than first rate. This profile may facilitate filling of the cavity without pinch off, for example.

Figure 5:
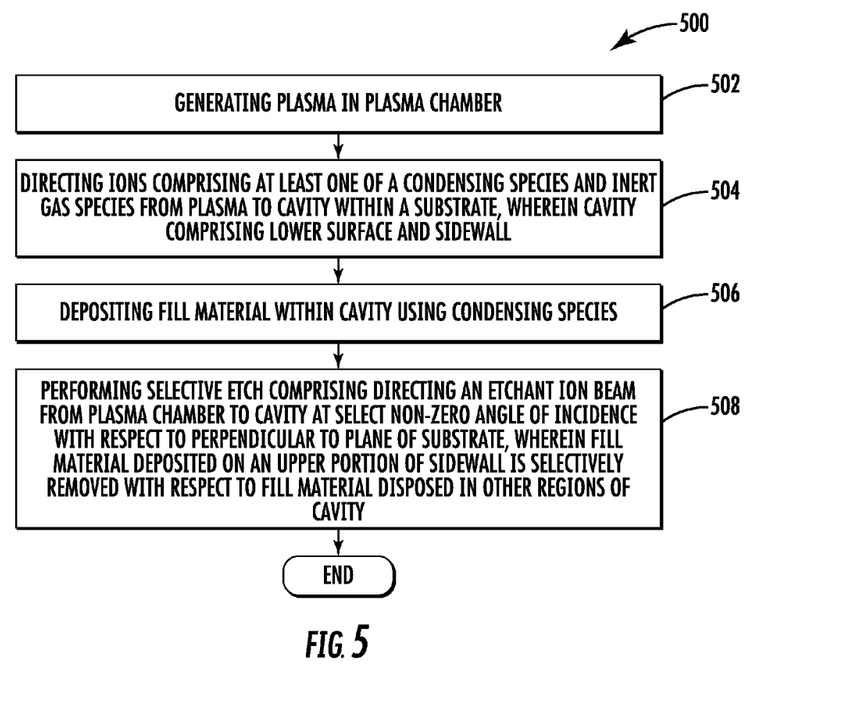
FIG. 5 depicts another exemplary process flow according to other embodiments of the disclosure.

FIG. 5 shows an exemplary process flow 500 according to embodiments of the disclosure. At block 502 a plasma is generated in a plasma chamber. At block 504, the operation is performed of directing ions comprising at least one of a condensing species and an inert gas species from the plasma to cavity within a substrate, where the cavity has a lower surface and a sidewall.

At block 506, the operation is performed of depositing a fill material within the cavity using a condensing species. In some embodiments, the condensing species may be provided in an ion beam directed at a non-zero angle of incidence with respect to a perpendicular to a plane of the substrate.

At block 508, a selective etch is performed. The selective etch may involve directing an etchant ion beam from a plasma chamber to the cavity at a select non-zero angle of incidence with respect to the perpendicular to the plane of the substrate. The fill material deposited on an upper portion of a sidewall of the cavity during a deposition operation may thus be selectively removed with respect to fill material disposed in other regions of the cavity.

In summary, the present embodiments provide advantages over known techniques for filling trenches or other cavities, including providing better capability to prevent damage of an active device area. For example, by directing ions at a non-zero angle of incidence with respect to a perpendicular, especially at initial stages of filling a trench, ions may be screened from striking the bottom of a trench, where sensitive device components may be located. In addition, embodiments of the disclosure provide better ability to avoid void formation, including in trenches having a high aspect ratio.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A method, comprising:
generating a plasma in a plasma chamber;
providing a substrate in a process chamber, adjacent the plasma chamber, the substrate having a cavity; and
depositing a fill material within the cavity by providing neutral species to the substrate and directing ions as an ion beam comprising a condensing species, from the plasma to the cavity at a non-zero angle of incidence with respect to a perpendicular to a plane of the substrate, wherein the ions do not strike a lower surface of the cavity during the depositing, wherein the neutral species comprise trajectories different from a trajectory of the ions,
wherein the depositing takes place concurrently with the directing the ions, and
wherein the fill material accumulates on a lower surface of the cavity at a first rate, and wherein the fill material accumulates on an upper portion of a sidewall of the cavity at a second rate less than the first rate.

2. The method of claim 1, the directing the ions comprising extracting the ions through an extraction plate having an elongated aperture.

3. The method of claim 2, the directing the ions further comprising:
providing a beam blocker within the plasma chamber adjacent the elongated aperture;
extracting a first portion of the ions as a first ion beam through a first portion of the aperture, the first portion forming a first non-zero angle of incidence with respect to the perpendicular; and
extracting a second portion of the ions as a second ion beam through a second portion of the elongated aperture, the second portion forming a second non-zero angle of incidence with respect to the perpendicular, wherein the perpendicular bisects the first non-zero angle of incidence and second non-zero angle of incidence.

4. The method of claim 1, further comprising providing a reactive species to the substrate without traversing the plasma chamber, the reactive species forming a part of the fill material.

5. The method of claim 1, wherein the fill material comprises a non-reentrant profile at least until a lowest level of the fill material is flush with a top of the cavity.

6. The method of claim 1, wherein the non-zero angle of incidence is 30 degrees or less.

7. The method of claim 1, further comprising reducing a magnitude of the non-zero angle of incidence during the directing the ions.

8. The method of claim 7, wherein the reducing the magnitude comprises increasing a gap between the substrate an extraction plate used to extract the ions from the plasma chamber.

9. The method of claim 1, wherein the condensing species are formed from a precursor gas directed into the plasma chamber, the method further comprising flowing the precursor gas into the plasma chamber at a first rate during at a first instance during the depositing, and flowing the precursor gas into the plasma chamber at a second rate less than the first rate at a second instance subsequent to the first instance during the depositing.

10. The method of claim 1, wherein the substrate comprises a second material different from the fill material, the method further comprising performing a selective etch of the fill material after the depositing the fill material, wherein a portion of the fill material is selectively removed with respect to the second material.

11. The method of claim 10, wherein the performing the selective etch comprises directing an etchant ion beam from the plasma chamber to the cavity at a select non-zero angle of incidence with respect to a perpendicular to the plane of the substrate, wherein fill material disposed on the upper portion of the sidewall is selectively removed with respect to fill material disposed in other regions of the cavity.

12. The method of claim 11, wherein the depositing the fill material and the performing the selective etch comprise a fill cycle, the method further comprising performing at least on additional fill cycle.

13. A method, comprising:
generating a plasma in a plasma chamber;
providing a substrate in a process chamber, adjacent the plasma chamber, the substrate having a cavity; and
depositing a fill material within the cavity by providing neutral species to the substrate and directing ions as an ion beam comprising at least one of a condensing species and inert gas species, from the plasma to the cavity, the ions forming a non-zero angle of incidence with respect to a perpendicular to a plane of the substrate, the cavity comprising a lower surface and a sidewall, wherein the ions do not strike a lower surface of the cavity during the depositing, wherein the neutral species comprise trajectories different from a trajectory of the ions, wherein the depositing takes place concurrently with the directing the ions;

and performing a selective etch comprising directing an etchant ion beam from the plasma chamber to the cavity at a select non-zero angle of incidence with respect to a perpendicular to the plane of the substrate, wherein fill material deposited on an upper portion of the sidewall is selectively removed with respect to fill material disposed in other regions of the cavity.

14. The method of claim 13, wherein the substrate comprises a second material, and wherein the selective etch comprises removing a portion of the fill material selectively with respect to the second material.

* * * * *